United States Patent
Makam et al.

(10) Patent No.: US 11,112,462 B2
(45) Date of Patent: Sep. 7, 2021

(54) ON-BOARD TIME-INDEPENDENT BATTERY USAGE DATA STORAGE

(71) Applicant: FCA US LLC, Auburn Hills, MI (US)

(72) Inventors: Sandeep Makam, Rochester Hills, MI (US); Abdullah-al Mamun, Livonia, MI (US); Konstantinos Siokos, Rochester Hills, MI (US); Lurun Zhong, Troy, MI (US)

(73) Assignee: FCA US LLC, Auburn Hills, MI (US)

( * ) Notice: Subject to any disclaimer, the term of this patent is extended or adjusted under 35 U.S.C. 154(b) by 190 days.

(21) Appl. No.: 16/561,937

(22) Filed: Sep. 5, 2019

(65) Prior Publication Data
US 2021/0072322 A1    Mar. 11, 2021

(51) Int. Cl.
| | | |
|---|---|---|
| *G01R 31/392* | (2019.01) | |
| *G01R 31/382* | (2019.01) | |
| *B60L 58/22* | (2019.01) | |
| *B60L 3/00* | (2019.01) | |
| *G07C 5/08* | (2006.01) | |
| *H02J 7/00* | (2006.01) | |
| *H01M 10/42* | (2006.01) | |

(52) U.S. Cl.
CPC .......... *G01R 31/392* (2019.01); *B60L 3/0069* (2013.01); *B60L 58/22* (2019.02); *G01R 31/382* (2019.01); *G07C 5/085* (2013.01); *H02J 7/0021* (2013.01); *H01M 10/4207* (2013.01); *H01M 2220/20* (2013.01)

(58) Field of Classification Search
USPC ........................................................ 320/132
See application file for complete search history.

(56) References Cited

U.S. PATENT DOCUMENTS

| | | | |
|---|---|---|---|
| 5,349,535 A | 9/1994 | Gupta | |
| 10,205,335 B2 | 1/2019 | Toshiba | |
| 2004/0044452 A1* | 3/2004 | Bauer | B60L 53/305 701/31.4 |
| 2010/0292877 A1* | 11/2010 | Lee | B60L 53/80 701/21 |
| 2012/0296512 A1 | 11/2012 | Lee et al. | |
| 2012/0310561 A1 | 12/2012 | Middleton et al. | |

(Continued)

FOREIGN PATENT DOCUMENTS

CN    111260185 A    6/2020

OTHER PUBLICATIONS

International Search Report and Written Opinion dated Nov. 19, 2020 for International Serial No. PCT/IB2020/059011, International Filing Date Sep. 25. 2020.

(Continued)

*Primary Examiner* — Mohammed Alam
(74) *Attorney, Agent, or Firm* — Ralph E. Smith

(57) ABSTRACT

Time domain battery usage data of a battery of an electrified powertrain of a vehicle in terms of average SOC, DOD and a set including average current flow rate and average battery temperature for each charge-discharge full cycle and half cycle of the battery during a use period are used to identify a location in a 3-D storage matrix (of fixed size and predetermined discretization levels for each dimension) in memory of an electronic control unit and a count in that location incremented. In an aspect, the charge-discharge full cycles and half cycles are identified using four-point rain-flow cycle counting.

12 Claims, 7 Drawing Sheets

(56) References Cited

U.S. PATENT DOCUMENTS

| | | |
|---|---|---|
| 2016/0209473 A1 | 7/2016 | You et al. |
| 2019/0033385 A1 | 1/2019 | Karner et al. |
| 2019/0033396 A1* | 1/2019 | Karner .................. H04W 4/021 |
| 2021/0072322 A1* | 3/2021 | Makam ................. H02J 7/0021 |

OTHER PUBLICATIONS

ASTM International, "Standard Practices for Cycle Counting in Fatigue Analysis", Deisgnation: E1049-85 (Reapproved 2005), Jun. 2005.

\* cited by examiner

| CYCLE TYPE | CYCLE NOTATION | AVERAGE SOC | DOD | CHARGE OR DISCHARGE CYCLE | AVERAGE C-RATE (1/Hr) | AVERAGE BATTERY TEMPERATURE (°C) |
|---|---|---|---|---|---|---|
| FULL CYCLE | $x_2 - x_5 - x'_2$ | $\frac{x_2 + x_5}{2}$ | $\|x_2 - x_5\|$ | CHARGE | $\frac{3600(x_2 - x_5)}{[t(x_5) - t(x_2)]}$ | $\frac{T_2 + T_5}{2}$ |
| FULL CYCLE | $x_3 - x_4 - x'_3$ | $\frac{x_3 + x_4}{2}$ | $\|x_3 - x_4\|$ | DISCHARGE | $\frac{3600(x_3 - x_4)}{[t(x_4) - t(x_3)]}$ | $\frac{T_3 + T_4}{2}$ |
| FULL CYCLE | $x_6 - x_7 - x'_6$ | $\frac{x_6 + x_7}{2}$ | $\|x_6 - x_7\|$ | CHARGE | $\frac{3600(x_6 - x_7)}{[t(x_7) - t(x_6)]}$ | $\frac{T_6 + T_7}{2}$ |
| HALF CYCLE | $x_1 - x_8$ | $\frac{x_1 + x_8}{2}$ | $\|x_1 - x_8\|$ | DISCHARGE | $\frac{3600(x_1 - x_8)}{[t(x_8) - t(x_1)]}$ | $\frac{T_1 + T_8}{2}$ |
| HALF CYCLE | $x_8 - x_9$ | $\frac{x_8 + x_9}{2}$ | $\|x_8 - x_9\|$ | CHARGE | $\frac{3600(x_8 - x_9)}{[t(x_9) - t(x_8)]}$ | $\frac{T_8 + T_9}{2}$ |

FIG. 7

ON-BOARD TIME-INDEPENDENT BATTERY USAGE DATA STORAGE

The present invention relates to automotive vehicles having an electrified powertrain, and more particularly, to a method of storing battery usage data that reduces the amount of memory used for storing the battery usage data.

BACKGROUND

FIG. 1 is a simplified block diagram representatively showing a vehicle 100 having an electrified powertrain 102. It should be understood that vehicle 100 can be a full electric vehicle or a hybrid electric vehicle. The electrified powertrain 102 includes a battery 104 (which is typically a battery pack having a plurality of battery modules/cells (not shown), a battery management system 106, a motor controller 108, an electric motor 110, and a charging system 112. The battery management system is referred to herein as "BMS." BMS 106 includes an electronic control unit 114, non-volatile memory 116 and volatile memory 118. An electronic control unit is referred to herein as an "ECU." It should be understood that either or both non-volatile memory 116 and volatile memory 118 can be included in electronic control unit 114 or can be separate.

Due to uncertainty in real-life driving patterns, geographic locations and environmental conditions, the usage of an on-board battery pack in a hybrid electric or full electric vehicle differs significantly from one vehicle to another as the vehicles are driven. These differences translate to a wide range of battery operating conditions that cause each battery pack to cycle and age differently. Hence control strategies and BMS's that dynamically adapt to the battery's state of health (referred to herein as SOH) would help improve the battery pack and battery cell performance and life. As is understood in the art, the BMS controls, among other things, the charging and discharging of the battery and such control strategies would typically be implemented in the BMS.

It is important to keep track of the history of battery operating conditions by collecting battery usage data such as the state of charge, referred to herein as SOC, polarity and magnitude of the current flowing into or from the battery, and battery temperature to achieve the following two objectives: develop an understanding of real-world battery duty-cycle from cumulative information collected from a large number of vehicles for battery pack design, sizing, control, calibration, etc.; and develop and periodically update the on-board SOH monitoring system and BMS to extend performance and useful battery life.

However, storing the time-dependent battery usage data on-board the vehicle would require a large amount of data storage which is typically not available in the on-board non-volatile memory in a vehicle, which may for example be non-volatile memory of the BMS. This on-board non-volatile memory in the vehicle will be referred to herein as on-board non-volatile memory. Additionally, it is not practical to allocate on-board non-volatile memory to store time series data without the knowledge of the time series length. Therefore, to achieve the above two objectives, an on-board storage technique should store time-dependent battery usage data in a fixed sized amount of on-board non-volatile memory irrespective of the time-length of data collection or frequency of data collection.

U.S. Pat. No. 5,349,535A discloses the use of a microprocessor and associated electronics, sensors, and memory to identify and accumulate statistics about the use of a battery pack. This is to facilitate a central billing system, for either a fixed or an interchangeable battery pack where battery usage data stored in the vehicle memory is downloaded from an electric vehicle when it is connected to a charger. The stored statistics are transferred to an external computer to bill users of the pack, estimate remaining pack life, provide a warning of abused packs and indicate the remaining range. A drawback of this approach is the inability to identify and store the most relevant information about the battery pack with a goal to assess battery aging and customer behavior. Also, a proper mechanism of storing time-dependent cycling data in a fixed on-board non-volatile memory for future retrieval is not discussed.

US Pub. No. 2012/0296512A1 focuses on real-time extraction and storage of battery usage data by transmitting data over a network to a cloud server and store battery usage data in a mass stationary memory for battery health prognostics. This approach assumes the availability and capability of a real-time data transfer interface and information flow between the vehicle and a cloud server which has a mass storage to store battery operating conditions. Such capability is not available in a wide range of current production vehicles.

US Pub. No. 2016/0209473A1 discloses the use of an apparatus to extract cyclic stress pattern for the battery and a life estimator to estimate cycle life on-board using an aging model. The aging model is predetermined and built based on the knowledge of identified cycle pattern of one or multiple stress factors. At least one of the voltage, current, and temperature data is sensed and uses the rainflow cycle counting method to extract cycles representing changes in sensed data over time. For each cycle, characteristics data including an offset, an amplitude, and a period is generated used to create a histogram. The number of cycles at each entry of the histogram is used in an on-board aging model to estimate the remaining useful life and transfer that life information via a communication device to the central vehicle control unit. In this approach, the cycle pattern and related characteristics data are not stored in the on-board non-volatile memory. Therefore, the battery operating characteristics of identified cycles are not available for future extraction to understand battery duty-cycle and consumer usage behavior. Cycles identified by the sensed battery data, for example, voltage, current, temperature, or pressure data is suitable for the specific aging model that depend on these cycles. However, these identified cycles will not be enough to correctly represent the estimated state of charge of the battery for these cycles for storage and future use to construct duty cycles. One of the objectives of storing battery usage data is to use them in an aging model to predict remaining useful life. For an aging model with a different level of fidelity and structure, the cyclic information based on sensed data might not be enough. For example, for a given constant charging current, the battery internal SOC will increase over time and will have more damaging effect on the battery as time progresses. Also, for a given charge/discharge current, the voltage of the battery might also reach to the maximum/minimum value but the battery may still be in a partially charged state. Therefore, identifying the number of cycles based on sensed data and extracting cycle characteristics in terms of an offset, an amplitude, and a period is not enough to estimate the internal state of the battery for each identified cycle. As a result, this solution lacks the ability to identify and extract proper charge-discharge cycle information represented by the SOC of the battery.

US Pub. No. 2012/0310561A1 discloses the use of the rainflow cycle counting method to identify charge-discharge cycles from the current profile over a given time interval. The magnitude of current and cycle time for each cycle are stored temporarily and used to estimate the battery SOH. After the time interval, a new set of cycles are identified to update the SOH. A drawback to this approach is the inability to store and retain the identified battery cyclic information in the non-volatile memory and their unavailability for future use to understand the real-life duty cycle. In addition to that, the magnitude of current and cycle time is not sufficient to extract the SOC information of the battery at each identified cycle.

The rainflow cycle counting method is known in the art, such as described in ASTM Standard E1049-85 (Reapproved 2005) for "Standard Practices for Cycle Counting in Fatigue Analysis," the entire disclosure of which is incorporated herein by reference, as well as described in certain of the above referenced patents/patent applications.

SUMMARY

In accordance with an aspect of the present disclosure, time domain battery usage data is stored more efficiently in a non-volatile memory of a vehicle having an electrified powertrain that includes a battery and a battery monitoring system that periodically collects the battery usage data at points in a use period. The battery usage data includes state of charge data indicative of a state of charge of the battery at the points in the use period, and current data indicative of current flowing into or from the battery at the points in the use period. The non-volatile memory has a three-dimensional storage matrix therein with each location of the three-dimensional storage matrix storing a count. The vehicle has an electronic control unit. The electronic control unit is configured to, and is used to, after the use period:
  a. identify battery charge-discharge full cycles of the battery during the use period; and
  b. for each identified charge-discharge full cycle:
    i. determine from the state of charge data an average state of charge for that identified charge-discharge full cycle;
    ii. determine from the state of charge data a depth of discharge for that identified charge-discharge full cycle;
    iii. determine from the current data an average current flow rate for that identified charge-discharge full cycle;
    iv. determine for that identified charge-discharge full cycle a location in the three-dimensional storage matrix to increment that corresponds to the determined average state of charge for that identified charge-discharge full cycle, determined depth of discharge for that identified charge-discharge full cycle and determined average current flow rate for that identified charge-discharge full cycle; and
    v. increment by the count in the determined location by a full increment.

In accordance with an aspect of the present disclosure, the method further includes having the electronic control unit after the use period identify charge-discharge half cycles of the battery that were not part of the identified charge-discharge full cycles; and for each identified charge-discharge half cycle having the electronic control unit:
  a. determine from the state of charge data an average state of charge for that identified charge-discharge half cycle;
  b. determine from the state of charge discharge data a depth of discharge for that identified charge-discharge half cycle;
  c. determine from the current data an average current flow rate for that identified charge-discharge half cycle;
  d. determine for that identified charge-discharge half cycle a location in the three-dimensional matrix to increment that corresponds to the determined average state of charge for that identified charge-discharge half cycle, determined depth of discharge for that identified charge-discharge half cycle, and determined average current flow rate for that identified charge-discharge half cycle; and
  d. increment by the count in the determined location by one-half the full increment.

In accordance with an aspect of the present disclosure, the battery usage data includes temperature data indicative of a temperature of the battery at the points in the use period and for each identified charge-discharge full cycle and for each identified charge-discharge half cycle, the electronic control unit is configured to and is used to determine an average battery temperature for that identified charge-discharge full cycle or identified charge-discharge half cycle and instead of identifying the location in the three-dimensional storage matrix corresponding to the average current flow rate, identifies a location in the three-dimensional storage matrix corresponding to a set that has the average current flow rate and the average battery temperature for that identified charge-discharge full cycle or for that identified charge-discharge half cycle and incrementing that identified location by the full increment for each identified charge-discharge full cycle or by one-half the full increment for each identified charge-discharge half cycle.

In an aspect, identifying the charge-discharge full cycles and half cycles includes using rainflow cycle counting to identify, based on the state of charge data, the charge-discharge full cycles and charge-discharge half cycles based on the state of charge data.

In an aspect, the full increment is one.

BRIEF DESCRIPTION OF THE DRAWINGS

The present invention will become more fully understood from the detailed description and the accompanying drawings, wherein:

FIG. 7 is a table showing the calculations of the average SOC, DOD, average C-rate, and average battery temperature for each charge-discharge full cycle and half cycle of FIG. 6.

DETAILED DESCRIPTION

Figure 1:
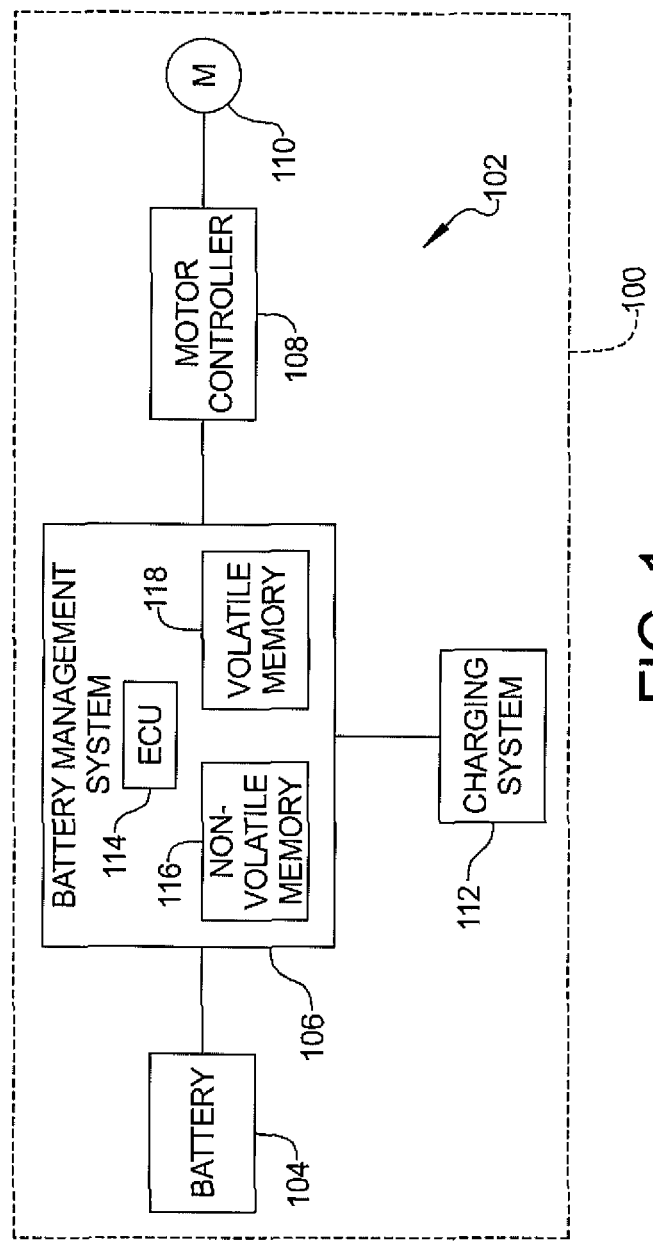
FIG. 1 is a simplified bock diagram of a prior art vehicle having an electrified powertrain.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

Real-time battery usage data is needed to understand the current state of battery aging, calculate the remaining life of the battery pack and understand and quantify driving behavior and battery usage over the lifetime of the vehicle. This battery usage data is also necessary for adaptive control strategies in the BMS (such as to incorporate the effect of aging). However, the amount of time domain battery usage data required to be stored for this purpose is massive and will grow as the duration or frequency of data storage increases. Time domain battery usage data is battery usage data at various points in use periods, such as when the vehicle is being operated. Instead, the battery usage data in terms of average SOC, depth of discharge referred to herein as DOD, and average current flow each charge-discharge full cycle of the battery during points in a use period are used to identify locations in a three-dimensional (3D) storage matrix in the non-volatile memory of an electronic control unit, such as an electronic control unit of the battery management system, and counts in each of those locations incremented. In an aspect, instead of average current flow rate, a set having the average current flow rate and an average battery temperature for the charge-discharge full cycle is used along with the average SOC and DOD to identify the location in the 3D storage matrix. In an aspect, the battery operating history in terms of these properties for each charge-discharge half cycle of the battery during the use period is also used to identify to a location in the 3-D matrix and the count in that location incremented by one-half. Electronic control unit will be referred to herein as "ECU." By way of example and not of limitation, this storage method is illustratively implemented in vehicle 100, such as in BMS 106 of vehicle 100. It should be understood that unless context dictates otherwise, as used herein, cycle refers to a full cycle and half cycle refers to a half cycle.

Important properties of a charge-discharge full cycle and half cycle of a battery in a vehicle having an electrified powertrain necessary to reconstruct them in the future are the average SOC, the DOD, and average current flow rate and directionality of current flow. In an aspect, these properties also include the average temperature of the battery to better assess usage condition. For a battery, one standard charge-discharge full cycle during a period of use during which the battery is being charged and discharged (such as when the vehicle is being driven) is one of the following: discharging the battery from a peak to a valley and charging the battery back from the valley to the peak (discharging the battery from a SOC=$X_1$ to a SOC=$X_2$ where $X_1$ is a peak and $X_2$ is the next valley after $X_1$ and charging back to SOC=$X_1$ where $X_1$>$X_2$), or charging the battery from a valley to a peak and discharging the battery from the peak back to the valley (charging the battery from a SOC=$X_1$ to a SOC=$X_2$ (where $X_1$ is a valley and $X_2$ is the next peak after $X_1$ and then discharging back to SOC=$X_1$ where $X_2$>$X_1$). $X_k$ is used herein as the value of the SOC at the respective peak or valley at the point k. As used herein, a peak is a point in the use period where the SOC changes from increasing to decreasing (state of charging or discharging of the battery changes from charging to discharging) and a valley is a point in the use period where the SOC changes from decreasing to increasing (state of charging or discharging of the battery changes from discharging to charging). Since all the battery SOC states in a time series data do not usually become a part of the identified charge-discharge full cycles, the equivalent number of charge-discharge half cycles from the remaining SOC states in the buffer should also be identified and stored to fully account for the total charge throughput of the battery in the time series data. A charge-discharge half cycle is a charge cycle (charging the battery from a valley to a peak) or a discharge cycle (discharging the battery from a peak to a valley). The impact of the directionality and the amplitude of the current, and temperature of each identified charge-discharge full cycle affect the overall cycle life of the battery and are also important to know to assess statistically driving usage behavior. Therefore, important properties of charge-discharge full cycles and in an aspect half cycles (average SOC, DOD, directionality of current, amplitude of current, and average battery temperature) should be stored in a memory efficient manner in the on-board non-volatile memory.

In accordance with an aspect of the present disclosure, battery usage data is stored in a manner that reduces the amount of memory used for storing the battery usage data. The number of charge-discharge full cycles, and in an aspect half cycles, that the battery experiences during each use period at each discrete combination of average SOC, DOD and average current flow rate (or, alternatively, set including average current flow rate and average battery temperature) is stored in the 3-D storage matrix. An array of discrete average SOC's and an array of discrete DOD's comprise two axes of the 3D matrix. The average SOC for each charge-discharge full cycle and the DOD for each charge-discharge full cycle are calculated as follows:

$$SOC_{avg} = \frac{(X_1 - X_2)}{2}$$

$$DOD = |X_1 - X_2|$$

where $X_1$ is the SOC at the beginning of the charge-discharge full cycle, $X_2$ is the SOC at the end of the first charge-discharge half cycle of charge-discharge full cycle. The third axis comprises either an average current flow rate for the charge-discharge full cycle, or a set that includes the average current flow rate and the average battery temperature of the charge-discharge full cycle. The average current flow, referred to herein as average C-rate, for each charge-discharge full cycle is calculated using either of the following:

$$\text{Average } C\text{-rate} = \frac{3600(X_1 - X_2)}{t(X_2) - t(X_1)}$$

$$\text{Average } C\text{-rate} = \frac{3600 * I}{Q}$$

where $X_1$ is again the SOC at the beginning of the charge-discharge full cycle, $X_2$ is again the SOC at the end of the first charge-discharge half cycle of the charge-discharge full cycle, $t(X_1)$ is the elapsed time in seconds during the use period at which SOC $X_1$ occurred, $t(X_2)$ is the elapsed time in seconds during the sample at which SOC $X_2$ occurred, I is current in amperes and Q is the nominal charge capacity of the battery in ampere-hours. Average battery temperature of the charge-discharge full cycle is calculated as follows:

$$T = \frac{T_1 + T_1}{2}$$

where $T_1$ is the temperature of the battery at the beginning of a charge-discharge full cycle corresponding to SOC $X_1$, and $T_2$ is the temperature after the first charge-discharge half cycle corresponding to SOC $X_2$. The same calculations are used to calculate the foregoing for charge-discharge half cycles with $X_1$ at the beginning of the charge-discharge half cycle and $X_2$ at the end of the charge-discharge half cycle.

Figure 2:
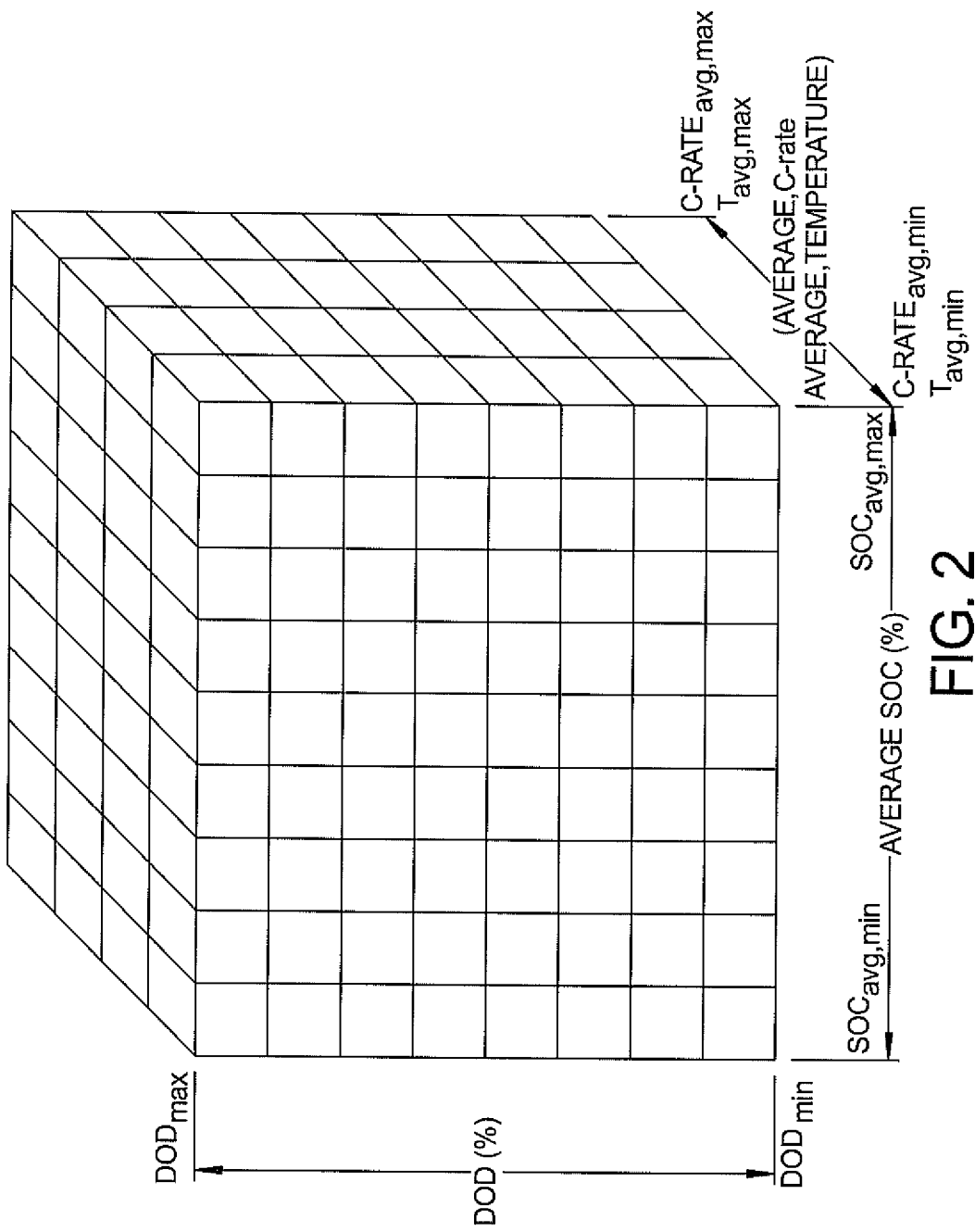
FIG. 2 shows a 3-D storage matrix in which battery usage data is stored in accordance with an aspect of the present disclosure.

FIG. 2 shows an illustration of the 3-D storage matrix where the X and Y axes are the average SOC of the charge-discharge full cycle and the DOD of the charge-discharge full cycle, respectively. The Z axis is the average C-rate or, alternatively, the set that includes the average C-rate and average battery temperature of the charge-discharge full cycles.

The foregoing storage method in accordance with an aspect of the present disclosure is now described in more detail. In the following, the Z axis is the set that includes the average C-rate and the average battery temperature.

An array of average SOC's is generated starting from 0% SOC to 100% SOC. The length of the array depends on the number of discretization ($N_{SOC}$) between minimum SOC ($SOC_{min}$) and maximum SOC ($SOC_{max}$).

Similarly, an array of DOD's is created where the length of the array depends on the number of discretization ($N_{DOD}$) levels between minimum DOD ($DOD_{min}$) and maximum DOD ($DOD_{max}$). The discretization for DOD can either be linear or logarithmic based on the expected frequency and magnitude of DOD for the identified charge-discharge full cycles and half cycles.

A single array is created to store the current or the current and temperature information, depending on whether the Z-axis is used for average current flow or the set including average current flow and average battery temperature. The current (I) is expressed in terms of average C-rate with an unit of $$\frac{1}{hr}$$

and temperature (T) is expressed in degree Celsius (° C.).

For average C-rate, a range of minimum to maximum current flow into or out of the battery ($C_{min}$ to $C_{max}$) is specified with $C_{min}=0$, and $C_{max}$ based on the knowledge of maximum possible current for a class of vehicle. A positive average C-rate represents discharging and a negative average C-rate represents charging. The number of average C-rate discretization, $N_C$ is used over the range, $[-C_{max}\ C_{max}]$. The temperature is discretized from $T_{min}$ to $T_{max}$ with the number of discretization, $N_T$. Therefore, the total number of discrete elements in the third axis is $N_M = N_C \times N_T$. Each element along the third axis represents a set that includes an average battery temperature and average C-rate. For example, the first location along the third axis contains the number of charge cycles with value $T_{min}$ and $-C_{max}$, where the last location contains the number of charge-discharge full cycles with temperature $T_{max}$ and C-rate $C_{max}$.

Then a 3-D storage matrix is created with the size $N_{SOC} \times N_{DOD} \times N_M$. The size of the 3-D storage matrix i.e., the value of $N_{SOC}$, $N_{DOD}$, and $N_M$, is set based on the allocated memory to store the 3-D storage matrix. As used herein, the 3-D storage matrix is a block of memory which each location in the block of memory is identified by three values—an X axis value which is the average state of charge, a Y axis value which is the DOD, and a Z axis value which is the set that includes the average C-rate and the average battery temperature. As discussed, in an alternative, Z axis value is the average C-rate.

This 3-ID storage matrix is used to store the information corresponding to each charge-discharge full cycle, and in an aspect also each charge-discharge half cycle, for each use period, illustratively at the conclusion of each use period. The charge-discharge full cycles and half cycles are illustratively identified using four point rainflow cycle counting based on the SOC data. It should be understood that the 3-D storage matrix is illustratively set up during manufacture of the vehicle, such as during a set-up procedure when the vehicle is calibrated. In an aspect, the use period is a key cycle and the charge-discharge full cycles, and in an aspect also the charge-discharge half cycles, that occurred during each key cycle of the vehicle are identified upon the conclusion of that key cycle. The average SOC, DOD, average C-rate, and average battery temperature are calculated for each such charge-discharge full cycle, and in an aspect for each charge-discharge half cycle, that was identified and the applicable counts in the 3-D storage matrix updated. A key cycle of a vehicle, as commonly understood in the art, is the period from when a vehicle is turned on to when it is turned off. It should be understood that use periods other than key cycles can be used, such as time durations (for example, every half-hour, every hour, etc.)

If a charge-discharge full cycle is identified which has a certain average SOC, DOD and set that includes the average battery temperature and C-rate, then a count in a location in the 3D storage matrix corresponding to the average SOC, DOD and the set including the average battery temperature and average C-rate of that charge-discharge full cycle is incremented by a full increment. In an aspect, if a charge-discharge half cycle is identified, the count in the location in the 3D storage matrix corresponding to the identified charge-discharge half cycle properties are incremented by one-half the full increment. In a preferred aspect, the full increment is one and one-half the full increment is one-half.

Figure 3:
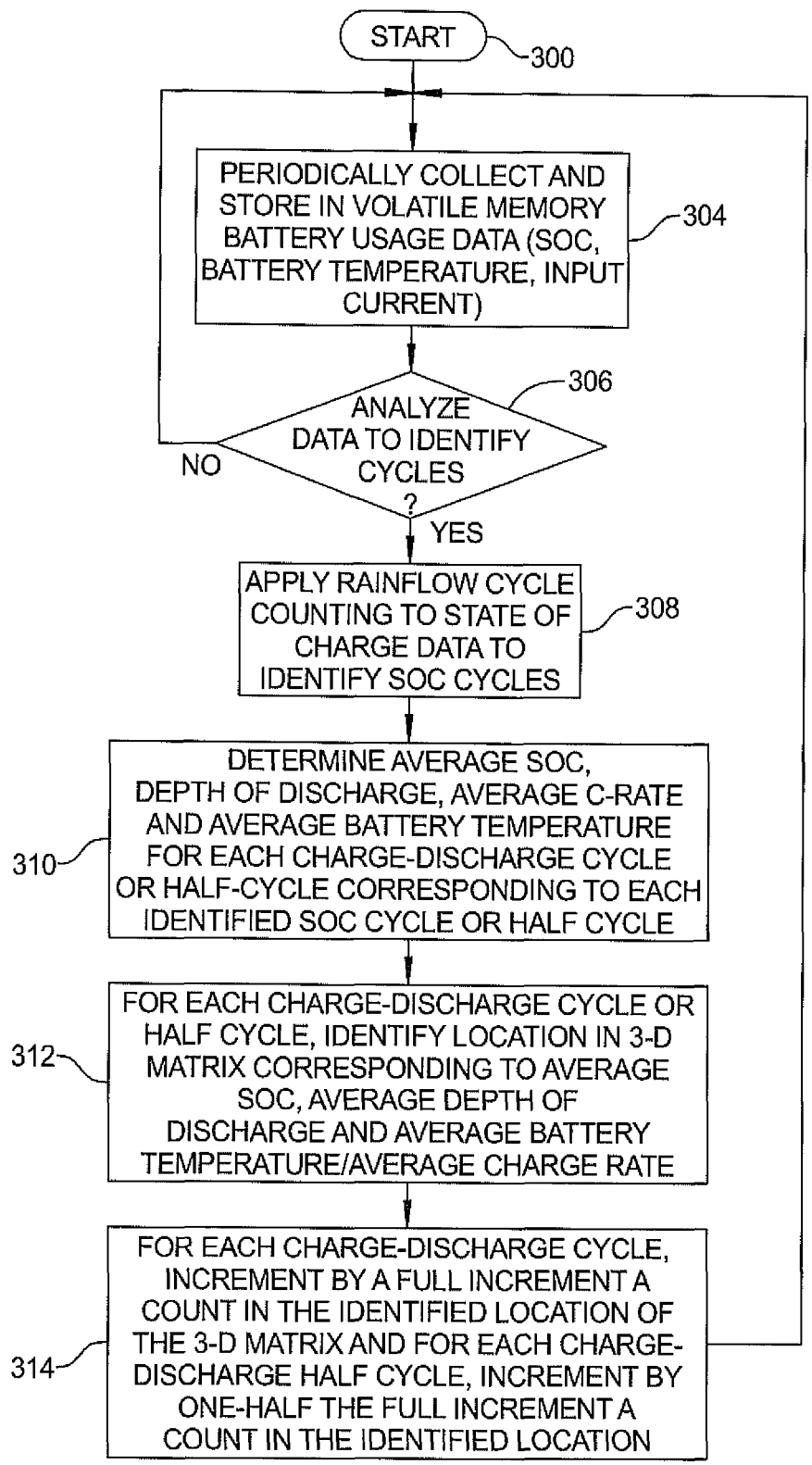
FIG. 3 is a flow chart for a control routine for a method of on-vehicle battery usage data storage in accordance with an aspect of the present disclosure.

FIG. 3 is a flow chart for a control routine for a method of on-vehicle battery usage data storage in accordance with an aspect of the present disclosure. The routine starts at 300 and proceeds to 304 where it periodically collects battery usage data, illustratively, input current, battery temperature and SOC corresponding to each upcoming point in time in the use period, which are stored in volatile memory of the vehicle (such as volatile memory 118 of the BMS). The routine then proceeds to 306 where it determines whether this data should be analyzed to identify charge-discharge full cycles and half cycles, such as by way of example and not of limitation, after the use period concludes, such as when the vehicle is turned off when the use period is a key cycle. If the data is to be analyzed, the routine proceeds to 308. If not, the routine branches back to 304.

At 308, the routine applies the four-point rainflow cycle counting rule to identify SOC full cycles and half cycles in the data collected during the use period. As discussed below, the charge-discharge full cycles and half cycles correspond to the SOC full cycles and half cycles. It should be understood that cycle counting other than rainflow cycle counting can be used to identify the SOC full cycles and half cycles, such as mean crossing range cycle counting.

The routine then proceeds to 310. At 310, the routine calculates for each charge-discharge full cycle and each charge-discharge half cycle that was identified, the average SOC, DOD, average C-rate and average battery temperature for that identified charge-discharge full cycle or half cycle. The routine then proceeds to 312 where it identifies a location in the 3-D storage matrix corresponding to the average SOC, DOD and the set that includes the average battery temperature and average C-rate for each identified charge-discharge full cycle and each identified charge-discharge half cycle. The routine then proceeds to 314 where it increments the count in the identified location in the 3-D storage matrix for each of the identified charge-discharge full cycles and half cycles by the above discussed full increment in the case of a charge-discharge full cycle and by one-half the increment in the case of a charge-discharge half cycle. As discussed above, in an aspect, the full increment is one and the half increment is one-half. The routine then branches to 304. In the 3-D storage matrix, each location corresponds to a specific range of average SOC in the x-direction, range of DOD in the y-direction and range of sets that include the average C-rate and average battery in the z-direction. It should be understood that the foregoing occurs for a plurality of use periods, such as for each use period.

Rainflow cycle counting, as is known in the art, is a method to extract cycles from complicated and irregular loading history. For a battery in a vehicle having an electrified powertrain in which the battery provides power to an electric motor of the electrified powertrain, the SOC profile presents the internal state of the battery from which the charge-discharge full cycles and half cycles are identified. In this regard, the charge-discharge full cycles and half cycles of the battery correspond to the SOC full cycles and SOC half cycles as the above discussed definitions of what constitutes a charge-discharge full cycle and a charge-discharge half cycle also define what constitutes a SOC full cycle and a SOC half cycle.

Figure 4:
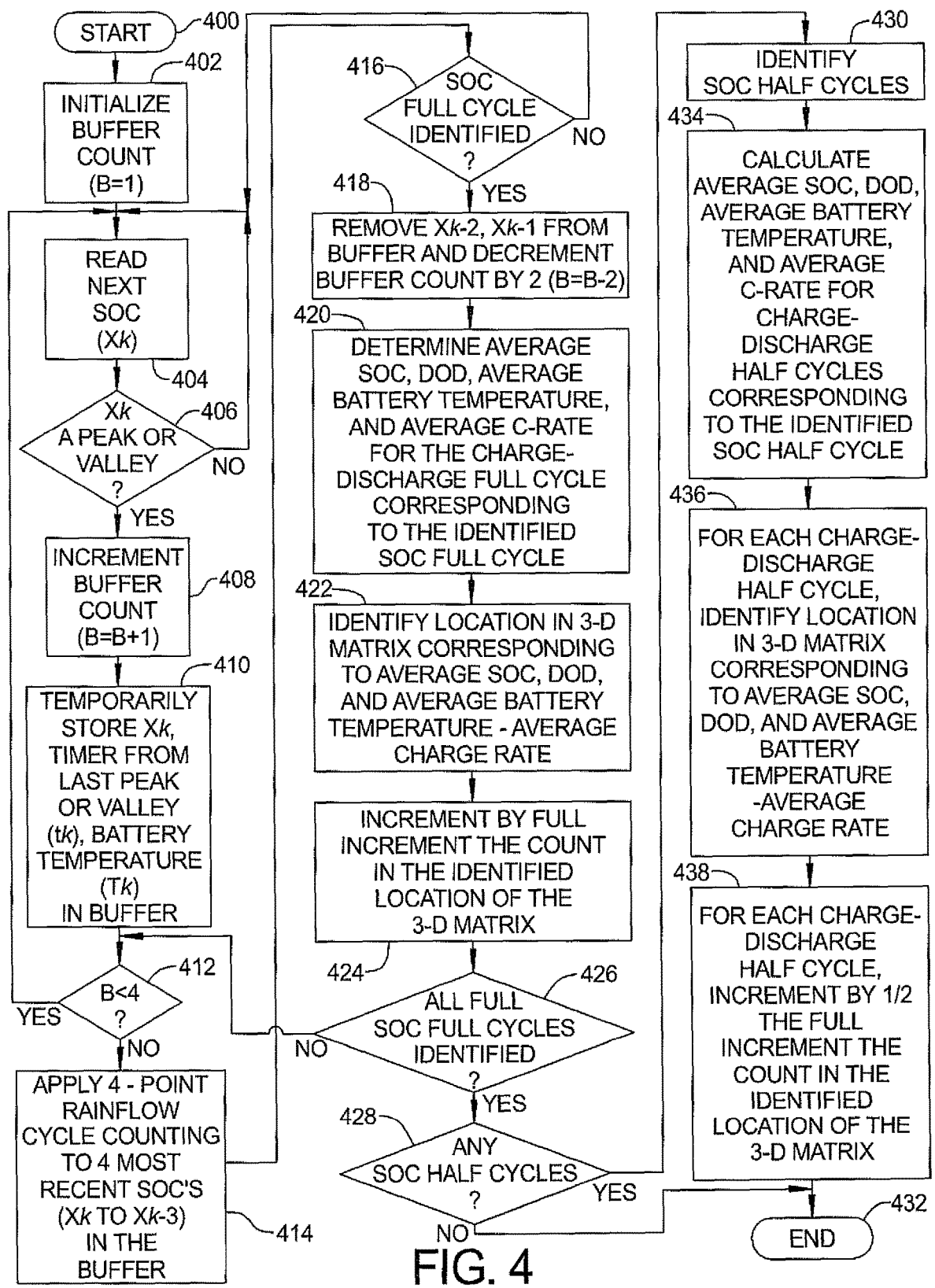
FIG. 4 is a flow chart showing an example of a control routine that is used to extract SOC full cycles and half cycles from time-dependent SOC data in real-time in accordance with an aspect of the present disclosure using four-point rainflow cycle counting.

FIG. 4 is a flow chart showing an example of logic for a routine that is used to extract the SOC full cycles and half cycles from the time-dependent SOC data in real-time in accordance with an aspect of the present disclosure using four-point rainflow cycle counting. The routine starts at 400 and proceeds to 402 where it initializes to 1 a buffer count (B) for a buffer in memory, such in the BMS. The routine then proceeds to 404 where it reads the next SOC ($X_k$) in the SOC data and then proceeds to 406. At 406, the routine determines whether $X_k$ is a peak or a valley. If not, the routine branches back to 402. If at 406 the routine determine that $X_k$ was a peak or a valley, the routine proceeds to 408 where it increments the buffer count (B) by 1 and then proceeds to 410. At 410, the routine temporarily stores the following in the buffer: $X_k$, the time ($t_k$) from the last peak or valley, and the battery temperature ($T_k$). The routine then proceeds to 412.

At 412, the routine checks whether there are at least four entries in the buffer—whether the buffer count (B) is at least four. If not, the routine branches back to 404. If at 412 there are at least four entries in the buffer, the routine proceeds to 414 where it applies four-point rainflow cycle counting to the four most recent SOC's ($X_k$ to $X_k$-3) in the buffer to identify SOC full cycles. The routine then proceeds to 416 where it determines if a SOC full cycle was identified. The routine determines that a SOC full cycle was identified when, in absolute value terms, the difference between the middle peak-valley is less than the difference between the first peak-valley and also less than the difference between the last peak-valley. As used herein, the term "peak-valley" includes a valley that precedes a peak as well as a peak that precedes a valley. That is, the routine determines that a SOC full cycle was identified when: $|X_{k-1}-X_{k-2}|<|X_k-X_{k-1}|$ and $|X_{k-2}-X_{k-1}| <|X_{k-2}-X_{k-3}|$. If at 416 a SOC full cycle was not identified, the routine branches back to 404. If at 416 a SOC full cycle was identified, the routine proceeds to 418 where it removes the middle peak-valley SOC values ($X_{k-1}$, $X_{k-2}$) from the buffer and decrements the buffer count by two (B=B-2). The routine then proceeds to 420 where it calculates for the charge-discharge full cycle corresponding to the identified SOC full cycle the average SOC, DOD, and set that includes the average C-rate and average battery temperature. The routine then proceeds to 422 where it identifies the location in the 3-D matrix corresponding to the average SOC, DOD and set that includes the average battery temperature and average C-rate, in each case for that charge-discharge full cycle. The routine then proceeds to 424 where it increments the count in the identified location in the 3D-matrix for that charge-discharge full cycle by the above discussed full increment, illustratively one. The routine then proceeds to 428 where it determines whether all SOC full cycles have been identified. If not, the routine branches to 412.

If at 428 the routine determines that all the SOC full cycles had been identified, the routine branches to 430 where it determines whether there are any SOC half cycles. If at 430 the routine determines that there are no SOC half cycles, the routine determines that it is done and proceeds to end at 432. If at 430 the routine determines that there are SOC half cycles, the routine proceeds to 434 where it identifies each SOC half cycle and proceeds to 436 where for each charge-discharge half cycle corresponding to each identified SOC half cycle, the routine calculates the average SOC, the DOD, the average C-rate and the average battery temperature, in each case for that charge-discharge half cycle. The routine then proceeds to 438 where it identifies a location in the 3-D matrix corresponding to the average SOC, DOD and set that includes the average battery temperature and average C-rate, for each identified charge-discharge half cycle. The routine then proceeds to 440 where it increments the count in the identified location in the 3D-matrix for each of the identified charge-discharge half cycles by one-half the above discussed full increment, such as by one-half when the full increment is one. The routine then branches to 432. The routine identifies SOC half cycles by any peak-valley where the peak SOC and the valley SOC of the peak-valley were not included in any SOC full cycle that was identified.

Figure 5:
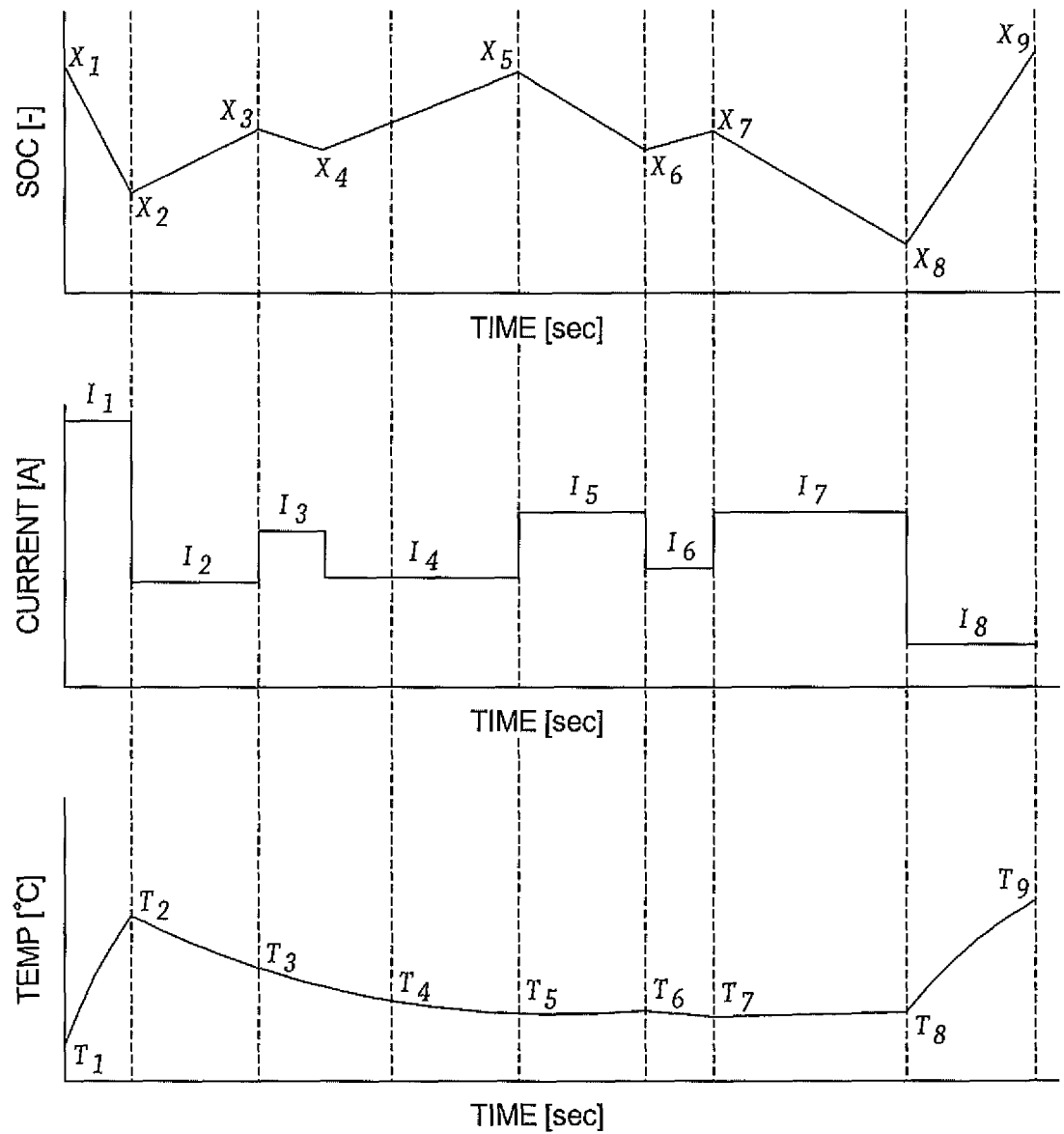
FIG. 5 shows an example battery SOC, current, and temperature profile.
Figure 6:
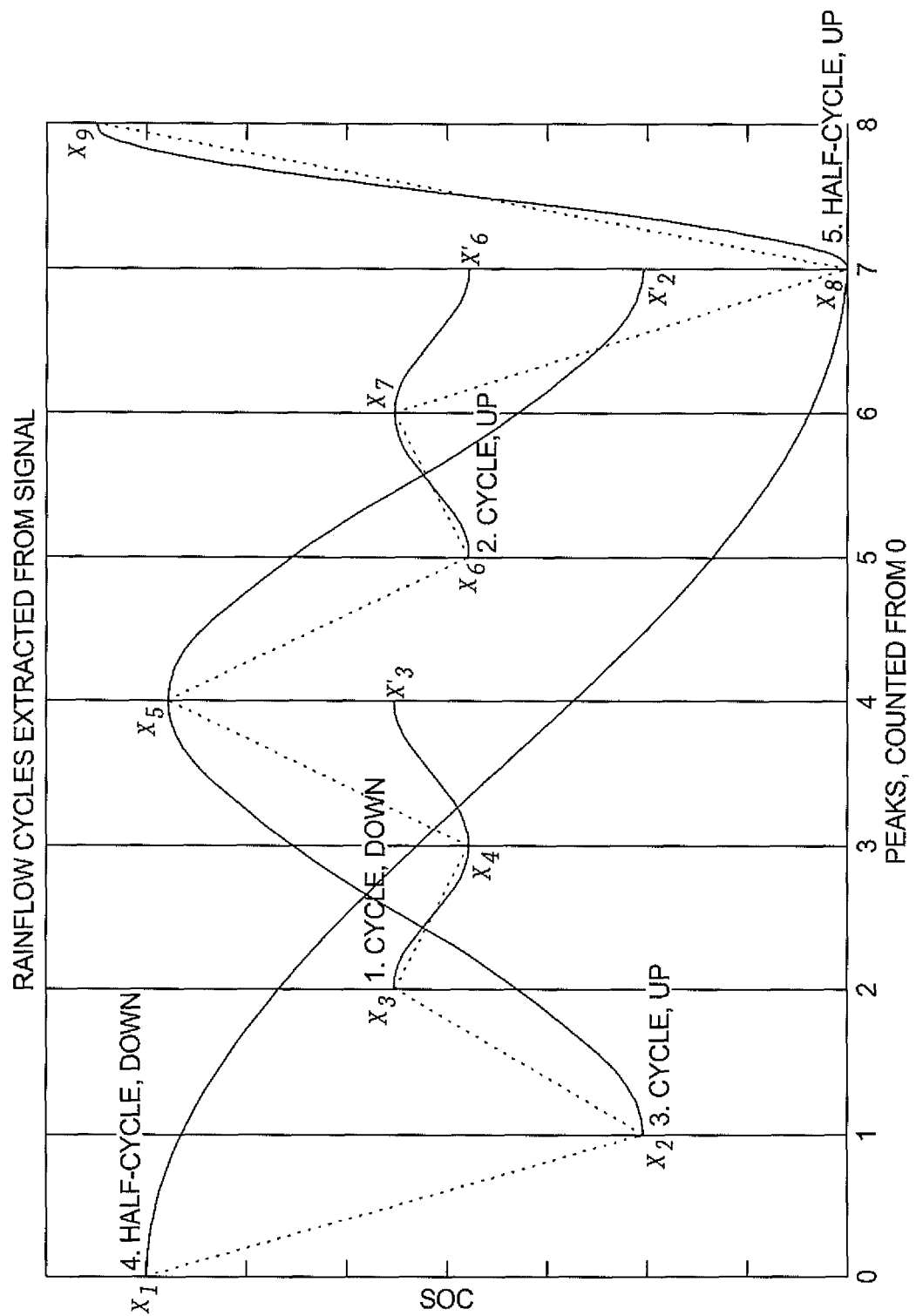
FIG. 6 is a chart showing the number of charge-discharge full cycles and half cycles identified from the SOC profile of FIG. 5 using 4-point rainflow cycle counting in accordance with an aspect of the present disclosure.

FIG. 5 shows an example battery SOC, current, and temperature profile where each SOC peak or valley is denoted by $X_k$. The current and temperature corresponding to each SOC peak or valley are also identified by I and T, respectively. Using the standard four point rainflow cycle counting rule, the number of charge-discharge full cycles and half cycles are identified from the SOC profile and presented in FIG. 6. From the description provided above, the formula to calculate the average SOC, DOD, average C-rate, and average battery temperature for each charge-discharge full cycle and half cycle are presented in the Table of FIG. 7. In the second column of this table, $X_i$–$X_j$–$X'_i$ represents a symmetric full cycle where $X'_i$ is an assumed end SOC which is the same as the initial SOC $X_i$. Based on the information identified in the Table of FIG. 7, the entries (counts) stored in of the constructed 3-D storage matrix are updated in real-time at the end of the use period. These counts are then retrievable, on-board or off-board and the battery usage data is reconstructable from these counts.

The electronic control unit such as ECU 114 in which the above described routines are implemented is or includes any of a digital processor (DSP), microprocessor, microcontroller, or other programmable device which are programmed with software implementing the above described methods along with associated memory. When it is stated that the electronic control unit performs a function or is configured to perform a function, it should be understood that the electronic control unit is configured to do so with appropriate logic (such as in software, logic devices, or a combination thereof).

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of more efficiently storing battery usage data in a non-volatile memory of a vehicle having an electrified powertrain that includes a battery and a battery management system that periodically collects the battery usage data at points in a use period, the battery usage data including state of charge data indicative of a state of charge of the battery at the points in the use period, and current data indicative of current flowing into or from the battery at the points in the use period, the non-volatile memory having a three-dimensional storage matrix therein with each location of the three-dimensional storage matrix storing a count, the method comprising:
   after the use period, having an electronic control unit of the vehicle:
   a. identify battery charge-discharge full cycles of the battery during the use period based on the state of charge data; and
   b. for each identified charge-discharge full cycle:
      i. determine from the state of charge data an average state of charge for that identified charge-discharge full cycle;
      ii. determine from the state of charge a depth of discharge for that identified charge-discharge full cycle;
      iii. determine from the current data average current flow rate for that identified charge-discharge full cycle;
      iv. determine for that identified cycle a location in the three-dimensional matrix to increment that corresponds to the determined average state of charge for that identified charge-discharge full cycle, determined depth of discharge for that identified charge-discharge full cycle, and determined average current flow rate for that identified charge-discharge full cycle; and
      v. increment the count in the determined location by a full increment.

2. The method of claim 1 further including having the electronic control unit after the use period identify charge-discharge half cycles of the battery that were not part of the identified charge-discharge full cycles and for each identified charge-discharge half cycle, having the electronic control unit:
   a. determine from the state of charge data an average state of charge for that identified charge-discharge half cycle;
   b, determine from the state of charge data a depth of discharge for that identified charge-discharge half cycle;
   c. determine from the current data an average current flow rate for that identified charge-discharge half cycle;
   e. determine for that identified charge-discharge half cycle a location in the three-dimensional matrix to increment that corresponds to the determined average state of charge for that identified charge-discharge half cycle, determined depth of discharge for that identified charge-discharge half cycle, and determined average current flow rate for that identified charge-discharge half cycle; and
   f. increment the count in the determined location by one-half the full increment.

3. The method of claim 2 wherein the battery usage data includes data indicative of a temperature of the battery at the points in the use period, the method further including for each identified charge-discharge full cycle and for each identified charge-discharge half cycle, determining an average battery temperature for that identified charge-discharge full cycle or identified charge-discharge half cycle and instead of identifying the location in the three-dimensional storage matrix corresponding to the average current flow rate, identifying a location in the three-dimensional storage matrix corresponding to a set that has the average current flow rate and the average battery temperature for that identified charge-discharge full cycle or for that identified charge-discharge half cycle and incrementing that location by the full increment for each identified charge-discharge full cycle or by one-half the full increment for each identified charge-discharge half cycle.

4. The method of claim 3 wherein identifying the charge-discharge full cycles and half cycles includes using rainflow cycle counting to identify the charge-discharge full cycles and charge-discharge half cycles based on the state of charge data.

5. The method of claim 4 wherein the full increment is one.

6. The method of claim 1 wherein the counts stored in the three dimensional storage matrix are retrievable.

7. A vehicle having an electrified powertrain, comprising:
   an electronic control unit, non-volatile memory, volatile memory, a battery and a battery management system;
   the battery management system configured to periodically collect battery usage data at points in a use period, the battery usage data including state of charge data indicative of a state of charge of the battery at the points in the use period, and current data indicative of current flowing into or from the battery at the points in the use period;
   the non-volatile memory having a three-dimensional storage matrix therein with each location of the three-dimensional matrix storing a count;
   the electronic control unit configured to after the use period:
   a. identify battery charge-discharge full cycles of the battery during the use period; and b. for each identified charge-discharge full cycle:
   i. determine from the state of charge data an average state of charge for that identified charge-discharge full cycle;
   ii. determine from the state of charge data a depth of discharge for that identified charge-discharge full cycle;
   iii. determine from the current data an average current flow rate for that identified charge-discharge full cycle;
   iv. determine for that identified charge-discharge full cycle a location in the three-dimensional storage matrix to increment that corresponds to the determined average state of charge for that identified charge-discharge full cycle, determined depth of discharge for that identified charge-discharge full cycle, and determined average current flow that identified charge-discharge full cycle; and
   v. increment the count in the determined location by a full increment.

8. The vehicle of claim 7 wherein the electronic control unit is further configured to identify charge-discharge half cycles of the battery that were not part of the identified charge-discharge full cycles and for each identified charge-discharge half cycle, the electronic control unit is configured to:
   a. determine from the state of charge data an average state of charge for that identified charge-discharge half cycle;
   b. determine from the state of charge data a depth of discharge for that identified charge-discharge half cycle;
   c. determine from the current data an average current flow rate for that identified charge-discharge half cycle;
   e. determine for that identified charge-discharge half cycle a location in the three-dimensional storage matrix to increment that corresponds to the determined average state of charge for that identified charge-discharge half cycle, determined depth of discharge for that identified charge-discharge half cycle, and determined average current flow rate for that identified charge-discharge half cycle; and
   f. increment the count in the determined location by one-half the full increment.

9. The vehicle of 8 wherein the battery usage data includes temperature data indicative of a temperature of the battery at the points in the use period and the electronic control unit is further configured to, for each identified charge-discharge full cycle and for each identified charge-discharge half cycle, determine an average battery temperature for that identified charge-discharge full cycle or identified charge-discharge half cycle and instead of identifying the location in the three-dimensional storage matrix corresponding to the average current flow rate, identifying a location in the three-dimensional storage matrix corresponding to a set that has the average current flow rate and average battery temperature for that identified charge-discharge full cycle or for that identified charge-discharge half cycle and incrementing that location by the full increment for each identified charge-discharge full cycle or by one-half the full increment for each identified charge-discharge half cycle.

10. The vehicle of claim 9 wherein the electronic control unit is configured to use rainflow counting to identify the charge-discharge full cycles and half cycles based on the state of charge data.

11. The vehicle of claim 9 wherein the full increment is one.

12. The vehicle of claim 7 wherein the counts stored in the three-dimensional storage matrix are retrievable.

* * * * *